(12) United States Patent
Stokes et al.

(10) Patent No.: US 10,601,396 B2
(45) Date of Patent: Mar. 24, 2020

(54) COPPER PILLAR BUMP PAD STRUCTURE FOR BAW DEVICES

(71) Applicant: Qorvo US, Inc., Greensboro, NC (US)

(72) Inventors: Paul Stokes, Orlando, FL (US); Vishwavasu Potdar, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/441,646

(22) Filed: Feb. 24, 2017

(65) Prior Publication Data
US 2017/0244380 A1    Aug. 24, 2017

Related U.S. Application Data

(60) Provisional application No. 62/299,061, filed on Feb. 24, 2016.

(51) Int. Cl.
*H03H 3/02*    (2006.01)
*H03H 9/17*    (2006.01)

(52) U.S. Cl.
CPC .............. *H03H 9/172* (2013.01); *H03H 3/02* (2013.01)

(58) Field of Classification Search
CPC ..... H03H 9/465; H03H 7/0115; H03H 9/6406
USPC ......................................................... 333/176
See application file for complete search history.

(56) References Cited

U.S. PATENT DOCUMENTS

| 8,890,336 B2* | 11/2014 | Lee | H01L 24/11 257/737 |
| 2013/0187246 A1* | 7/2013 | Adkisson | H03H 9/64 257/416 |
| 2016/0028367 A1* | 1/2016 | Shealy | H03H 3/02 310/321 |
| 2016/0094199 A1* | 3/2016 | David | H03H 7/38 333/133 |

OTHER PUBLICATIONS

Zazerin, "Bragg reflector acoustic impedance RLC model", ISSN 1811-4512. ElectronComm 2015, vol. 20, No. 1(84), pp. 90-96.*
Lee et al., "Packaging Technology and Design Challenge for Fine Pitch Micro-Bump Cu-Pillar and BOT Using TCNPC Underfill Method", Apex Expo IPC, Mar. 2014.*

(Continued)

*Primary Examiner* — Benny T Lee
*Assistant Examiner* — Hafizur Rahman
(74) *Attorney, Agent, or Firm* — Withrow & Terranova, P.L.L.C.

(57) ABSTRACT

A bulk acoustic wave (BAW) device includes a substrate, a reflector on the substrate, a piezoelectric layer on the reflector and including a first opening through which a portion of the reflector is exposed, an electrode layer on the portion of the reflector exposed through the first opening, a passivation layer on the piezoelectric layer and a portion of the electrode layer and including a second opening through which a portion of the electrode layer is exposed, an under-bump metallization layer on the portion of the electrode layer exposed through the second opening and extending over the second opening and the first opening on the passivation layer, and a copper pillar structure on the under-bump metallization layer such that the entirety of the under-bump metallization layer is covered by the copper pillar structure.

22 Claims, 4 Drawing Sheets

(56) References Cited

OTHER PUBLICATIONS

Wu et al., "Ultraminiaturized Three-Dimensional IPAC Packages With 100 µm Thick Glass Substrates for Radio Frequency Front-End Modules", J. Electron. Packaging 139(4), 041001 (Jul. 27, 2017) (Year: 2017).*
Definition of the word "encapsulated", Merriam-Webster Dictionary (Year: 1828).*
Wagner et al., "New Generation of High-Performance TC-SAW Components for Module Integration", EPCOS AG, TDK Group, Sixth International Symposium on Acoustic Wave Devices for future Mobile Communications Systems, Japan, Nov. 2015, pp. 62-66 (Year: 2015).*

* cited by examiner ic wave

COPPER PILLAR BUMP PAD STRUCTURE FOR BAW DEVICES

RELATED APPLICATIONS

This application claims the benefit of provisional patent application Ser. No. 62/299,061, filed Feb. 24, 2016, the disclosure of which is hereby incorporated herein by reference in its entirety.

FIELD OF THE DISCLOSURE

The present disclosure relates to bulk acoustic wave (BAW) devices, and in particular to BAW devices with wafer level packaging.

BACKGROUND

Consumer demand for wireless communications devices with increased carrier network compatibility and data throughput continues to increase the size and complexity of radio frequency (RF) circuitry therein. Said RF circuitry may include several acoustic filters for isolating transmit and receive signals in different RF frequency bands. These acoustic filters often consume a significant amount of area in the RF circuitry, which is often due to the size of acoustic resonators used in the filters. As an example, acoustic filters may include a number of bulk acoustic wave (BAW) resonators. Conventionally, these BAW resonators have been provided in wirebond packages, which are associated with a large cross-sectional area. By reducing the size of the BAW resonators used in the acoustic filters, the overall size of the RF circuitry discussed above may be significantly reduced. Accordingly, there is a present need for BAW resonators with reduced size.

SUMMARY

The present disclosure relates to bulk acoustic wave (BAW) devices, and in particular to BAW devices with wafer level packaging. In one embodiment, a BAW device includes a substrate, a reflector, a piezoelectric layer, an electrode layer, a passivation layer, an under-bump metallization layer, and a copper pillar structure. The reflector is on the substrate. The piezoelectric layer is on the reflector and includes a first opening through which a portion of the reflector is exposed. The electrode layer is on the portion of the reflector exposed through the first opening. The passivation layer is on the piezoelectric layer and a portion of the electrode layer, and includes a second opening through which a portion of the electrode layer is exposed. The under-bump metallization layer is on the portion of the electrode layer exposed through the second opening and extends over the second opening and the first opening on the passivation layer. The copper pillar structure is on the under-bump metallization layer such that the entirety of the under-bump metallization layer is covered by the copper pillar structure. By providing the passivation layer such that it extends over the first opening to cover a portion of the electrode layer, providing the under-bump metallization layer such that it extends over second opening and the first opening on the passivation layer, and providing the copper pillar structure such that it covers the entirety of the under-bump metallization layer, the reliability of an electrical connection to the BAW device via the copper pillar structure may be significantly improved when compared to conventional designs. Accordingly, the reliability and lifespan of the BAW device may be increased.

In one embodiment, a method for manufacturing a BAW device begins by providing a substrate. A reflector is provided on the substrate. A piezoelectric layer is provided on the reflector. A first opening is formed in the piezoelectric layer through which a portion of the reflector is exposed. An electrode layer is provided on the portion of the reflector exposed through the first opening. A passivation layer is provided on the piezoelectric layer and the electrode layer. A second opening is formed in the passivation layer through which a portion of the electrode layer is exposed. An under-bump metallization layer is provided on the portion of the electrode layer exposed through the second opening such that the under-bump metallization layer extends over the second opening and the first opening on the passivation layer. A copper pillar structure is provided on the under-bump metallization layer such that the entirety of the under-bump metallization layer is covered by the copper pillar structure. By providing the passivation layer such that it extends over the first opening to cover a portion of the electrode layer, providing the under-bump metallization layer such that it extends over the second opening and the first opening on the passivation layer, and providing the copper pillar structure such that it covers the entirety of the under-bump metallization layer, the reliability of an electrical connection to the BAW device via the copper pillar structure may be significantly improved when compared to conventional designs. Accordingly, the reliability and lifespan of the BAW device may be increased.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
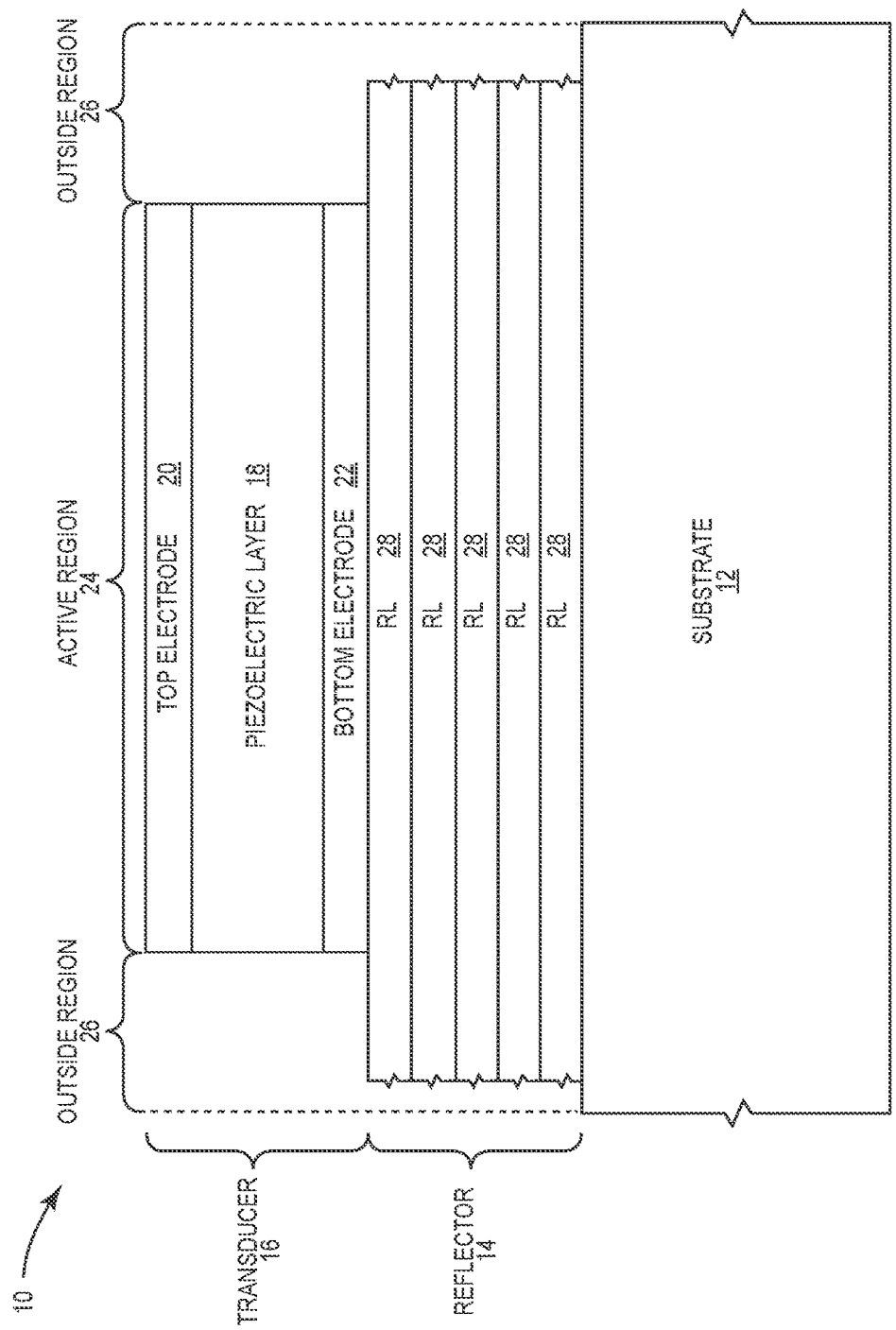
FIG. 1 is a cross-sectional view of a bulk acoustic wave (BAW) device in a related art.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

An exemplary BAW device 10 is illustrated in FIG. 1. The BAW device 10 generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top electrode 20 and the bottom electrode 22 may be formed of Tungsten (W), Molybdenum (Mo), Platinum (Pt), or like material, and the piezoelectric layer 18 may be formed of Aluminum Nitride (AlN), Zinc Oxide (ZnO) or other appropriate piezoelectric material. Although shown in FIG. 1 as each including a single layer, the piezoelectric layer 18, the top electrode 20, and/or the bottom electrode 22 may include multiple layers of the same material, multiple layers in which at least two layers are different materials, or multiple layers in which each layer is a different material.

The BAW device 10 is divided into an active region 24 and an outside region 26. The active region 24 generally corresponds to the section of the BAW device 10 where the top electrode 20 and the bottom electrode 22 overlap and also includes the layers below the overlapping top electrode 20 and the bottom electrode 22. The outside region 26 corresponds to the section of the BAW device 10 that surrounds the active region 24.

For the BAW device 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by an air-metal boundary at the top surface of the top electrode 20. Acoustic waves traveling downwardly are reflected back into the transducer 16 by the reflector 14, or by an air cavity, which is provided just below the transducer in a Film BAW Resonator (FBAR).

The reflector 14 is typically formed by a stack of reflectors (RL) 28, which alternate in material composition to produce a significant reflection coefficient at the junction of adjacent reflectors 28. Typically, the reflectors 28 alternate between materials having high and low acoustic impedances, such as tungsten (W) and silicon dioxide ($SiO_2$). While only five reflectors 28 are illustrated in FIG. 1, the number of reflectors 28 and the structure of the reflector 14 will vary from one design to another.

Figure 2:
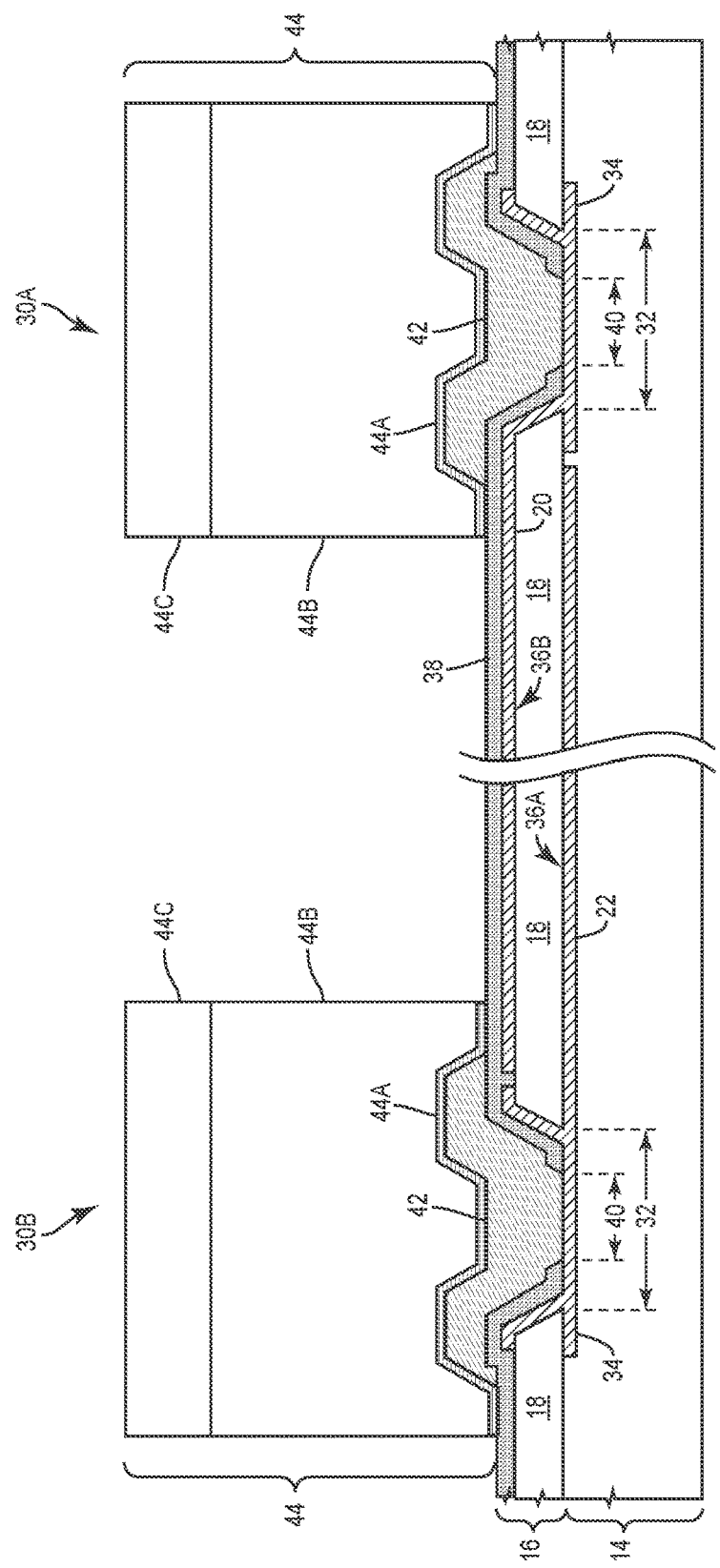
FIG. 2 shows details of a BAW device according to one embodiment of the present disclosure.

Conventionally, connections have been made to the top electrode 20 and the bottom electrode 22 via wirebonds, which as discussed above may add to the cross-sectional area of the device. Accordingly, there is a desire for BAW resonators with wafer level packaging. Accordingly, FIG. 2 shows the transducer 16 of the BAW device 10 including connections for the top electrode 20 and the bottom electrode 22 according to one embodiment of the present disclosure. The reflector 14 of the BAW device 10 is shown for context. The BAW device 10 includes a first contact 30A and a second contact 30B. The first contact 30A is coupled to the top electrode 20, while the second contact 30B is coupled to the bottom electrode 22.

Each one of the contacts 30 is formed in a first opening 32 in the piezoelectric layer 18, which exposes a portion of the reflector 14 through the piezoelectric layer 18. In some embodiments, a recess is formed in the reflector 14 in the first opening 32 as shown in FIG. 2 such that an electrode layer 34 extends into a surface of the reflector 14. The electrode layer 34 is on the portion of the reflector 14 exposed through the first opening 32. In some embodiments, the electrode layer 34 may extend over the first opening 32 on a first surface 36A of the piezoelectric layer 18 on the reflector 14 and/or on a second surface 36B of the piezoelectric layer 18 opposite the first surface 36A. In the case of the first contact 30A, the electrode layer 34 extends over the first opening 32 on the second surface 36B of the piezoelectric layer 18 to contact the top electrode 20. In the case of the second contact 30B, the electrode layer 34 extends over the first opening 32 on the first surface 36A of the piezoelectric layer 18 to contact the bottom electrode 22. A passivation layer 38 is on the piezoelectric layer 18 and a portion of the electrode layer 34. The passivation layer 38 includes a second opening 40 through which a portion of the electrode layer 34 is exposed.

An under-bump metallization layer 42 is on the portion of the electrode layer 34 exposed through the second opening 40 and extends over the second opening 40 and the first opening 32 on the passivation layer 38. A copper pillar structure 44 is on the under-bump metallization layer 42 such that the entirety of the under-bump metallization layer 42 is covered by the copper pillar structure 44. The copper pillar structure 44 may include an under-bump metallization interface layer 44A on the under-bump metallization layer 42, a pillar layer 44B on the under-bump metallization interface layer 44A, and a solder layer 44C on the pillar layer 44B.

Figure 3:
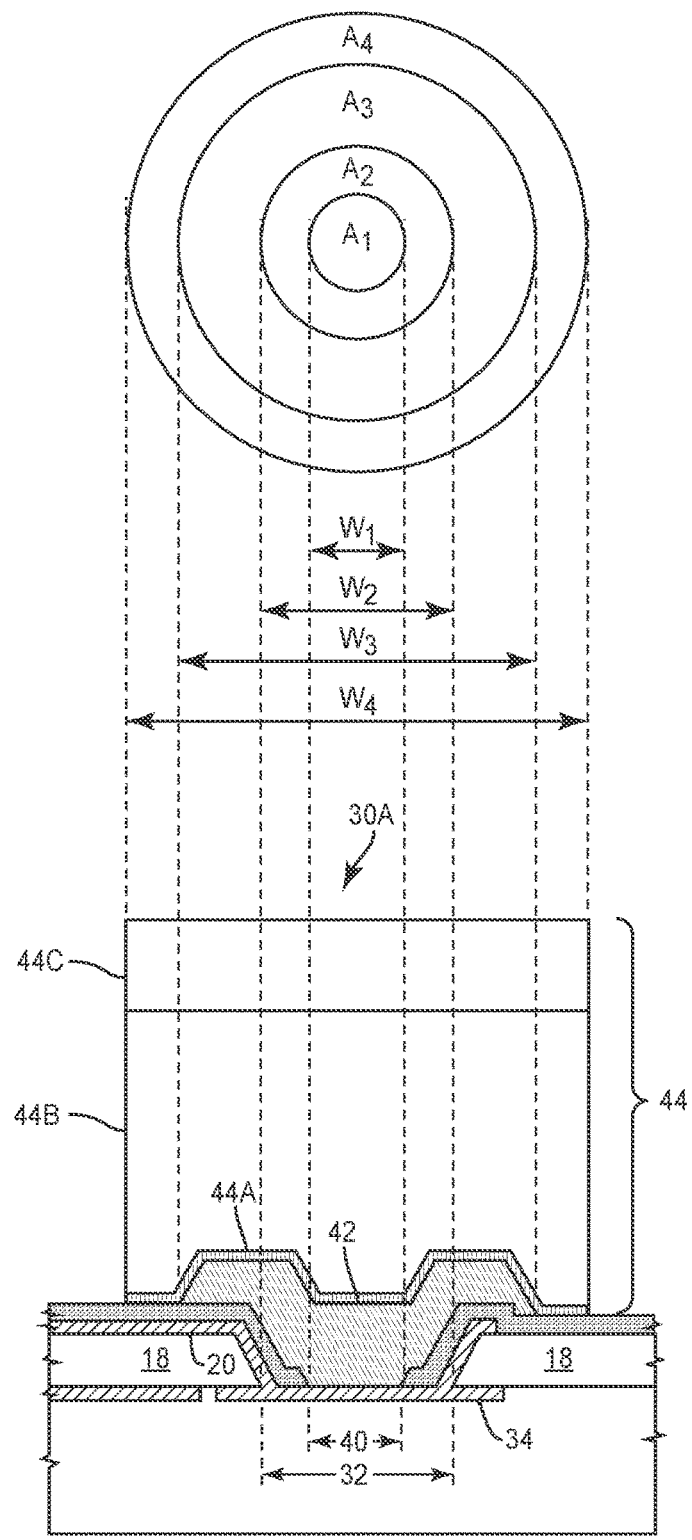
FIG. 3 shows details of a BAW device according to one embodiment of the present disclosure.

FIG. 3 shows a top view of the first contact 30A to illustrate the relative dimensions of the components thereof. As shown in FIG. 3, the second opening 40 defines a first area $A_1$, which is encompassed by a second area $A_2$ defined by the first opening 32. The outer perimeter of the under-bump metallization layer 42 defines a third area $A_3$, which encompasses the first area $A_1$ and the second area $A_2$. The outer perimeter of the copper pillar structure 44 defines a fourth area $A_4$, which encompasses the first area $A_1$, the second area $A_2$, and the third area $A_3$. In one embodiment, a width $W_1$ (i.e., diameter) of the second opening 40 is between 1.0 µm and 2.0 µm, a width $W_2$ (i.e., diameter) of the first opening 32 is between 1.5 µm and 2.5 µm, a width $W_3$ (i.e., diameter) defined by the outer perimeter of the under-bump metallization layer 42 is between 2.5 µm and 3.5 µm, and a width $W_4$ (i.e., diameter) defined by the outer perimeter of the copper pillar structure 44 is between 3.5 µm and 4.5 µm. While the first contact 30A is shown as a circular structure, those skilled in the art will appreciate that the first contact 30A first contact 30A may be provided in any shape without departing from the principles herein. The second contact 30B will be substantially similar to the first contact 30A.

In one embodiment, the electrode layer 34 may comprise aluminum, tungsten, copper, titanium, titanium nitride, tantalum, molybdenum, iridium, ruthenium, silicide, and the like. The passivation layer 38 may comprise silicon nitride. The under-bump metallization layer 42 may comprise a copper aluminum alloy. The under-bump metallization interface layer 44A may comprise a titanium tungsten alloy. The pillar layer 44B may comprise copper. The solder layer 44C may comprise tin. Those skilled in the art will recognize that many suitable materials may exist for providing the functionality of the electrode layer 34, the passivation layer 38, the under-bump metallization layer 42, the under-bump metallization interface layer 44A, the pillar layer 44B, and the solder layer 44C, all of which are contemplated herein.

The resulting BAW device 10 is a flip-chip package, which may allow for the outside region 26 discussed above with respect to FIG. 1 to be reduced or eliminated altogether. Accordingly, the cross-sectional area of the BAW device 10 may be significantly reduced when compared to conventional wirebond devices. The contacts 30 may be significantly more robust and reliable than those formed by conventional means. This may be due to three design constraints satisfied by the contacts 30. First, the first opening 32 in the piezoelectric layer 18 is within an outer perimeter of the under-bump metallization layer 42. Second, the second opening 40 in the passivation layer 38 is within an outer perimeter of the piezoelectric layer 18. And third, the copper pillar structure 44 surrounds the under-bump metallization layer 42 such that an outer perimeter of the copper pillar structure 44 extends beyond the outer perimeter of the under-bump metallization layer 42 and is on the surface of the passivation layer 38. Whereas conventional contacts for BAW devices may shear at forces less than 130 g, the contacts 30 discussed above may withstand forces in excess of 160 g, and in some cases, up to 220 g.

Figure 4:
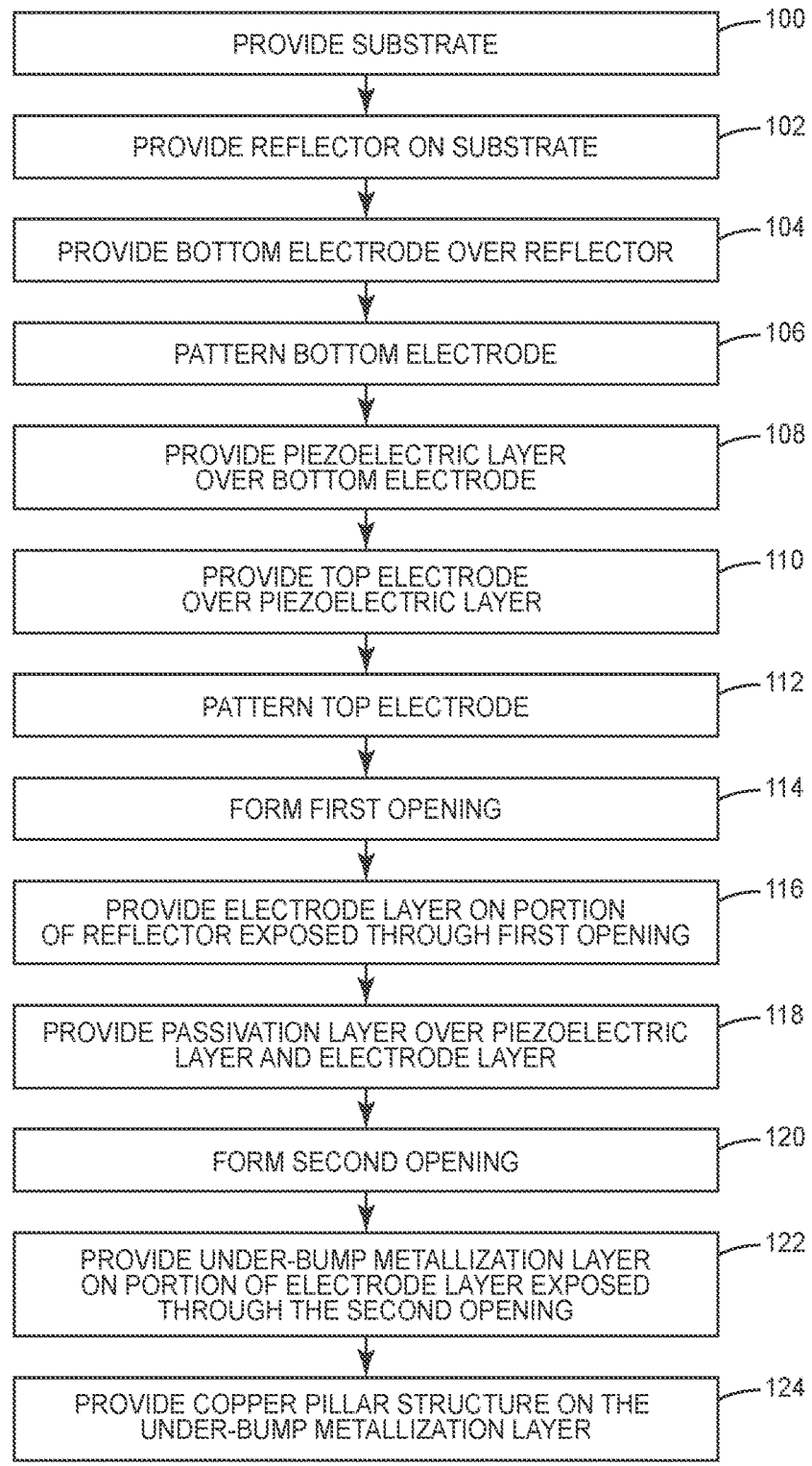
FIG. 4 is a flow chart illustrating a method for manufacturing a BAW device according to one embodiment of the present disclosure.

FIG. 4 illustrates a method for manufacturing the BAW device 10 discussed above according to one embodiment of the present disclosure. First, the substrate 12 is provided (step 100). The reflector 14 is then provided on the substrate 12 (step 102). The bottom electrode 22 is then provided over the reflector 14 (step 104) and patterned as desired (e.g., to create an isolated region for the bottom of the first contact 30A shown above in FIG. 2) (step 106). The piezoelectric layer 18 is then provided over the bottom electrode 22 (step 108). The top electrode 20 is provided over the piezoelectric layer 18 (step 110) and patterned as desired (e.g., to create an isolated region for the second contact 30B as shown above in FIG. 2) (step 112). The first opening 32 is then formed in the top electrode 20 and the piezoelectric layer 18 (step 114). In some embodiments, forming the first opening 32 includes forming a recess in the exposed portion of the reflector 14 in the first opening 32. The electrode layer 34 is provided on the portion of the reflector 14 exposed through the first opening 32 (step 116). The passivation layer 38 is provided on the piezoelectric layer 18 and the electrode layer 34 (step 118). The second opening 40 is then formed in the passivation layer 38 (step 120). The under-bump metallization layer 42 is provided on the portion of the electrode layer 34 exposed through the second opening 40 such that the under-bump metallization layer 42 extends over the second opening 40 and the first opening 32 on the passivation layer 38 as discussed above (step 122). The copper pillar structure 44 is then provided on the under-bump metallization layer 42 such that the entirety of the under-bump metallization layer 42 is covered by the copper pillar structure 44 (step 124).

Those skilled in the art will recognize improvements and modifications to the preferred embodiments of the present disclosure. All such improvements and modifications are considered within the scope of the concepts disclosed herein and the claims that follow.

What is claimed is:

1. A bulk acoustic wave (BAW) device comprising:
   a substrate;
   a reflector on the substrate;
   a piezoelectric layer on the reflector, the piezoelectric layer comprising a first opening through which a portion of the reflector is exposed;
   an electrode layer on the portion of the reflector exposed through the first opening;
   a passivation layer on the piezoelectric layer and the electrode layer, the passivation layer comprising a second opening through which a first portion of the electrode layer is exposed;
   an under-bump metallization layer extending into the first opening of the piezoelectric layer and residing over the first portion of the electrode layer exposed through the first opening of the piezoelectric layer and the second opening of the passivation layer, and extending over the second opening and the first opening on the passivation layer; and
   a copper pillar structure on the under-bump metallization layer such that the under-bump metallization layer is completely encapsulated by the copper pillar structure.

2. The BAW device of claim 1 wherein the copper pillar structure comprises an under-bump metallization interface layer and a pillar layer over the under-bump metallization interface layer.

3. The BAW device of claim 2 wherein the under-bump metallization interface layer comprises a titanium tungsten alloy and the pillar layer comprises copper.

4. The BAW device of claim 3 wherein the copper pillar structure further comprises a solder layer comprising tin.

5. The BAW device of claim 1 wherein the piezoelectric layer comprises a first surface on the reflector and a second surface opposite the first surface.

6. The BAW device of claim 5 wherein the electrode layer extends over the first opening, wherein a second portion of the electrode layer extends on the second surface of the piezoelectric layer.

7. The BAW device of claim 5 wherein the electrode layer extends over the first opening, wherein a second portion of the electrode layer extends on the first surface of the piezoelectric layer.

8. The BAW device of claim 5 further comprising an additional electrode layer, wherein:
the piezoelectric layer further comprises a third opening through which an additional portion of the reflector is exposed;
the additional electrode layer is on the additional portion of the reflective exposed through the third opening;
the passivation layer is on the additional electrode layer and comprises a fourth opening, through which a first portion of the additional electrode layer is exposed;
the electrode layer further extends over the first opening, wherein a second portion of the electrode layer extends on the first surface of the piezoelectric layer; and
the additional electrode layer extends over the third opening, wherein a second portion of the additional electrode layer extends on the second surface of the piezoelectric layer, such that a portion of the piezoelectric layer is sandwiched between the second portion of the electrode layer and the second portion of the additional electrode layer.

9. The BAW device of claim 1 further comprising a recess in the portion of the reflector exposed through the first opening, wherein the electrode layer is provided on the reflector in the recess.

10. The BAW device of claim 1 wherein:
the piezoelectric layer comprises aluminum nitride;
the passivation layer comprises silicon nitride; and
the under-bump metallization layer comprises an aluminum copper alloy.

11. The BAW device of claim 1 wherein the electrode layer further extends over exposed surfaces of the piezoelectric layer within the first opening.

12. A method for manufacturing a bulk acoustic wave (BAW) device comprising:
providing a substrate;
providing a reflector on the substrate;
providing a piezoelectric layer on the reflector;
forming a first opening in the piezoelectric layer through which a portion of the reflector is exposed;
providing an electrode layer on the portion of the reflector exposed through the first opening;
providing a passivation layer on the piezoelectric layer and the electrode layer;
forming a second opening in the passivation layer through which a first portion of the electrode layer is exposed;
providing an under-bump metallization layer into the first opening of the piezoelectric layer and over first the portion of the electrode layer exposed through the second opening such that the under-bump metallization layer extends over the second opening and the first opening on the passivation layer; and
providing a copper pillar structure on the under-bump metallization layer such that the under-bump metallization layer is completely encapsulated by the copper pillar structure.

13. The method of claim 12 wherein:
the piezoelectric layer comprises aluminum nitride;
the passivation layer comprises silicon nitride; and
the under-bump metallization layer comprises an aluminum copper alloy.

14. The method of claim 12 wherein the electrode layer further extends over exposed surfaces of the piezoelectric layer within the first opening.

15. The method of claim 12 wherein the piezoelectric layer comprises a first surface on the reflector and a second surface opposite the first surface.

16. The method of claim 15 wherein the electrode layer is provided to extend over the first opening, wherein a second portion of the electrode layer extends on the second surface of the piezoelectric layer.

17. The method of claim 15 wherein the electrode layer is provided to extend over the first opening, wherein a second portion of the electrode layer extends on the first surface of the piezoelectric layer.

18. The method of claim 15 further comprising:
forming a third opening in the piezoelectric layer through which an additional portion of the reflector is exposed;
providing an additional electrode layer on the additional portion of the reflector exposed through the third opening;
providing the passivation layer on the additional electrode layer;
forming a fourth opening in the passivation layer, through which a first portion of the additional electrode layer is exposed, wherein:
the electrode layer further extends over the first opening, wherein a second portion of the electrode layer extends on the first surface of the piezoelectric layer; and
the additional electrode layer further extends over the third opening, wherein a second portion of the additional electrode layer extends on the second surface of the piezoelectric layer, such that a portion of the piezoelectric layer is sandwiched between the second portion of the electrode layer and the second portion of the additional electrode layer.

19. The method of claim 18 wherein forming the first opening comprises forming a recess in the portion of the reflector exposed through the first opening, wherein the electrode layer is provided on the reflector in the recess.

20. The method of claim 12 wherein providing the copper pillar structure comprises providing an under-bump metallization interface layer on the under-bump metallization layer and providing a pillar layer over the under-bump metallization interface layer.

21. The method of claim 20 wherein the under-bump metallization interface layer comprises a titanium tungsten alloy and the pillar layer comprises copper.

22. The method of claim 21 wherein providing the copper pillar structure further comprises providing a solder layer on the pillar layer, the solder layer comprising tin.

* * * * *

UNITED STATES PATENT AND TRADEMARK OFFICE
CERTIFICATE OF CORRECTION

| | |
|---|---|
| PATENT NO. | : 10,601,396 B2 |
| APPLICATION NO. | : 15/441646 |
| DATED | : March 24, 2020 |
| INVENTOR(S) | : Paul Stokes et al. |

Page 1 of 1

It is certified that error appears in the above-identified patent and that said Letters Patent is hereby corrected as shown below:

In the Claims

Claim 8,
Column 7, Line 27, replace "of the reflective exposed through the third opening;" with --of the reflector exposed through the third opening;--.
Column 7, Line 34, replace "the additional electrode layer extends" with --the additional electrode layer further extends--.

Signed and Sealed this
Nineteenth Day of May, 2020

Andrei Iancu
*Director of the United States Patent and Trademark Office*